United States Patent
Chen et al.

(10) Patent No.: US 12,010,811 B1
(45) Date of Patent: Jun. 11, 2024

(54) CABLE CLIP ASSEMBLY AND METHOD FOR COMPUTING SYSTEM

(71) Applicant: Quanta Computer Inc., Taoyuan (TW)

(72) Inventors: Chao-Jung Chen, Taoyuan (TW);
Chih-Hsiang Lee, Taoyun (TW);
Chih-Ming Chen, Taoyuan (TW);
Cheng-Hsiang Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/193,110

(22) Filed: Mar. 30, 2023

Related U.S. Application Data

(60) Provisional application No. 63/478,840, filed on Jan. 6, 2023.

(51) Int. Cl.
*H05K 7/14* (2006.01)

(52) U.S. Cl.
CPC ................................. *H05K 7/1491* (2013.01)

(58) Field of Classification Search
CPC ...... H05K 7/1491; H02G 3/32; H02G 3/0456; F16L 3/13; F16L 3/2235; F16L 3/227
USPC ............................................ 248/49, 55, 68.1
See application file for complete search history.

(56) References Cited

U.S. PATENT DOCUMENTS

| | | | | |
|---|---|---|---|---|
| 4,395,009 A * | 7/1983 | Bormke | ................... | H02G 3/32 |
| | | | | 174/157 |
| 5,060,810 A * | 10/1991 | Jones | ..................... | A47F 7/0035 |
| | | | | 248/68.1 |
| 5,201,484 A * | 4/1993 | Thoen | ................... | F16L 3/2235 |
| | | | | 248/68.1 |
| 6,431,500 B1 * | 8/2002 | Jacobs | ...................... | F16L 3/13 |
| | | | | 248/51 |
| 2019/0178420 A1 * | 6/2019 | Etheridge | ............ | H02G 3/0456 |
| 2019/0323632 A1 * | 10/2019 | Bechtold | ............... | F16L 3/2235 |
| 2022/0240409 A1 * | 7/2022 | Doglio | .................... | G06F 1/189 |

* cited by examiner

*Primary Examiner* — Muhammad Ijaz
(74) *Attorney, Agent, or Firm* — NIXON PEABODY LLP

(57) ABSTRACT

A cable clip assembly for a computing device includes a primary clip with a primary surface between first and second primary ends. The first side extends in a first transverse direction from the first primary end, and the second side extends in the first transverse direction from the second primary end. Cable-receiving holes are arranged longitudinally between the first and second sides. A secondary clip has a secondary surface and is attached to the primary clip via the first and second sides. The secondary clip is movable relative to the primary clip between a cable installation position and a secured cable position, and is removably attached at one or more of the first and second sides. A compressible interface is attached to the primary surface, includes a flexible material that compresses when subjected to an installation force, and creates an airflow barrier in an installed position within the computing device.

14 Claims, 15 Drawing Sheets

CABLE CLIP ASSEMBLY AND METHOD FOR COMPUTING SYSTEM

RELATED APPLICATIONS

This application claims priority to and the benefit of U.S. Provisional Application No. 63/478,840, filed on Jan. 6, 2023, which is incorporated herein by reference in its entirety.

FIELD OF THE INVENTION

The present invention relates generally to routing cables in a computing system, and more specifically, to a clamp assembly for sealing air flow in a computing cable duct.

BACKGROUND OF THE INVENTION

Computing systems, and especially server systems, require routing of cables for connecting heat-generating electronic devices, such as chipsets. Typically, some present cooling configurations require airflow for cooling the computing system. However, a problem with current configurations is that cooling airflow escapes through gaps or holes through which the cables are routed. The escaped airflow reduces cooling efficiency, potentially resulting in malfunctioning of the computing system from overheated electronic components. The present disclosure provides a solution for these and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cable clip assembly for a computing device includes a primary clip having a primary surface. The primary surface extends longitudinally, along a length of the cable clip assembly, between a first primary end and a second primary end. The cable clip assembly further includes a first side extending in a first transverse direction, along a height of the cable clip assembly, from the first primary end. The cable clip assembly further includes a second side extending in the first transverse direction from the second primary end. The cable clip assembly further includes a plurality of cable-receiving holes that are arranged longitudinally between the first side and the second side. The cable clip assembly further includes a secondary clip having a secondary surface. The secondary clip is attached to the primary clip via the first side and the second side. The secondary clip is movable relative to the primary clip between a cable installation position and a secured cable position. The secondary clip is removably attached at one or more of the first side and the second side. The cable clip assembly further includes a compressible interface attached to the primary surface. The compressible interface includes a flexible material that compresses when subjected to an installation force. The compressible interface creates an airflow barrier in an installed position within the computing device.

According to another aspect of the cable clip assembly described above, the compressible interface covers the primary surface entirely.

According to another aspect of the cable clip assembly described above, the compressible interface includes at least in part a sponge material.

According to another aspect of the cable clip assembly described above, the installation force is caused when the compressible interface is in direct contact with a secondary surface of another cable clip assembly installed within the computing device.

According to another aspect of the cable clip assembly described above, each of the first side and the second side has toolless connectors for removal or attachment of the primary clip and the secondary clip.

According to another aspect of the cable clip assembly described above, the primary clip is connected to the secondary clip at the second side via a rotational hinge connector. The primary clip is rotated away from the secondary clip at the first side in the cable installation position.

According to another aspect of the cable clip assembly described above, one or more holes of the plurality of cable-receiving holes is a circular hole.

According to another aspect of the cable clip assembly described above, each hole of the plurality of cable-receiving holes is separated into two separate indentations when the secondary clip is disassembled from the primary clip.

According to other aspects of the present disclosure, a cable clip assembly for a computing device includes a primary clip. The primary clip is defined by a length of the cable clip assembly along a longitudinal direction, a width of the cable clip assembly along a lateral direction, and a height of the cable clip assembly along a transverse direction. The primary clip has a primary surface extending longitudinally between a first primary end and a second primary end, and a first primary side extending in a first transverse direction from the first primary end. The primary clip further has a second primary side extending in the first transverse direction from the second primary end, and a plurality of primary cable-receiving indentations arranged longitudinally between the first primary side and the second primary side. The cable clip assembly further includes a secondary clip having a secondary surface extending longitudinally between a first secondary end and a second secondary end, and a first secondary side extending in a second transverse direction from the first secondary end. The second transverse direction is opposite to the first transverse direction. The first secondary side is removably attached to the first primary side of the primary clip. The secondary clip further has a second secondary side extending in the second transverse direction from the second secondary end. The second secondary side is removably attached to the second primary side of the primary clip. The secondary clip further has a plurality of secondary cable-receiving indentations arranged longitudinally between the first secondary side and the second secondary side. Each secondary indentation of the plurality of secondary cable-receiving indentations matches a respective one of the plurality of primary cable-receiving indentations to form an enclosed cable-receiving hole when the secondary clip is assembled with the primary clip. The cable clip assembly further includes a compressible interface attached to the primary surface. The compressible interface includes a flexible material that compresses when subjected to an assembly force. The compressible interface creates an airflow barrier when the cable clip assembly is in an installed position within the computing device.

According to another aspect of the cable clip assembly described above, the primary surface is flat-shaped.

According to another aspect of the cable clip assembly described above, the compressible interface covers the primary surface entirely.

According to another aspect of the cable clip assembly described above, the compressible interface includes at least in part a sponge material.

According to another aspect of the cable clip assembly described above, each primary indentation of the plurality of cable-receiving indentations is defined by a primary contact surface extending longitudinally between two primary ridges. Each primary indentation extends laterally the entire width of the primary surface.

According to another aspect of the cable clip assembly described above, the primary contact surface has a middle area that is closer to the primary surface than to the primary ridges.

According to another aspect of the cable clip assembly described above, each secondary indentation of the plurality of cable-receiving indentations is defined by a secondary contact surface extending longitudinally between two secondary ridges. Each secondary indentation extends laterally the entire width of the secondary surface.

According to another aspect of the cable clip assembly described above, the first primary side has a first primary connector, the second primary side has a second primary connector, the first secondary side has a first secondary connector, and the second secondary side has a second secondary connector. Each of the first primary connector, the second primary connector, the first secondary connector, and the second secondary connector is a toolless connector.

According to another aspect of the cable clip assembly described above, the enclosed cable-receiving hole is a circular hole.

According to other aspects of the present disclosure, a method for assembly of computing cables is directed to a computing device. The method includes providing a first cable clip assembly in a first cable installation position in which a first primary clip is separated from a first secondary clip. The method further includes routing first computing cables, respectively, in first cable-receiving holes of the first cable clip assembly. The method further includes attaching the first secondary clip to the first primary clip to secure the first computing cables within the first cable clip assembly. The method further includes installing the first cable clip assembly in a cable duct of a computing device. The method further includes providing a second cable clip assembly in a second cable installation position in which a first secondary clip is separated from a second secondary clip. The method further includes routing second computing cables, respectively, in second cable-receiving holes of the second cable clip assembly. The method further includes attaching the second secondary clip to the first secondary clip to secure the second computing cables within the second cable clip assembly. The method further includes installing the second secondary clip in the cable duct of the computing device. The second secondary clip is in direct contact with a compressible interface of the first cable clip assembly. The second secondary clip produces an installation force that compresses the compressible interface. The compressible interface creates an airflow barrier that prevents airflow between the first cable clip assembly and the second cable clip assembly.

According to another aspect of the method described above, the method further includes attaching the first secondary clip to the first primary clip via toolless connectors at two opposite sides of the first cable clip assembly According to another aspect of the method described above, the method further includes rotating the first secondary clip relative to the first primary clip at one side of the first cable clip assembly. The first secondary clip is hingedly connected to the first primary clip at another side of the first cable clip assembly.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
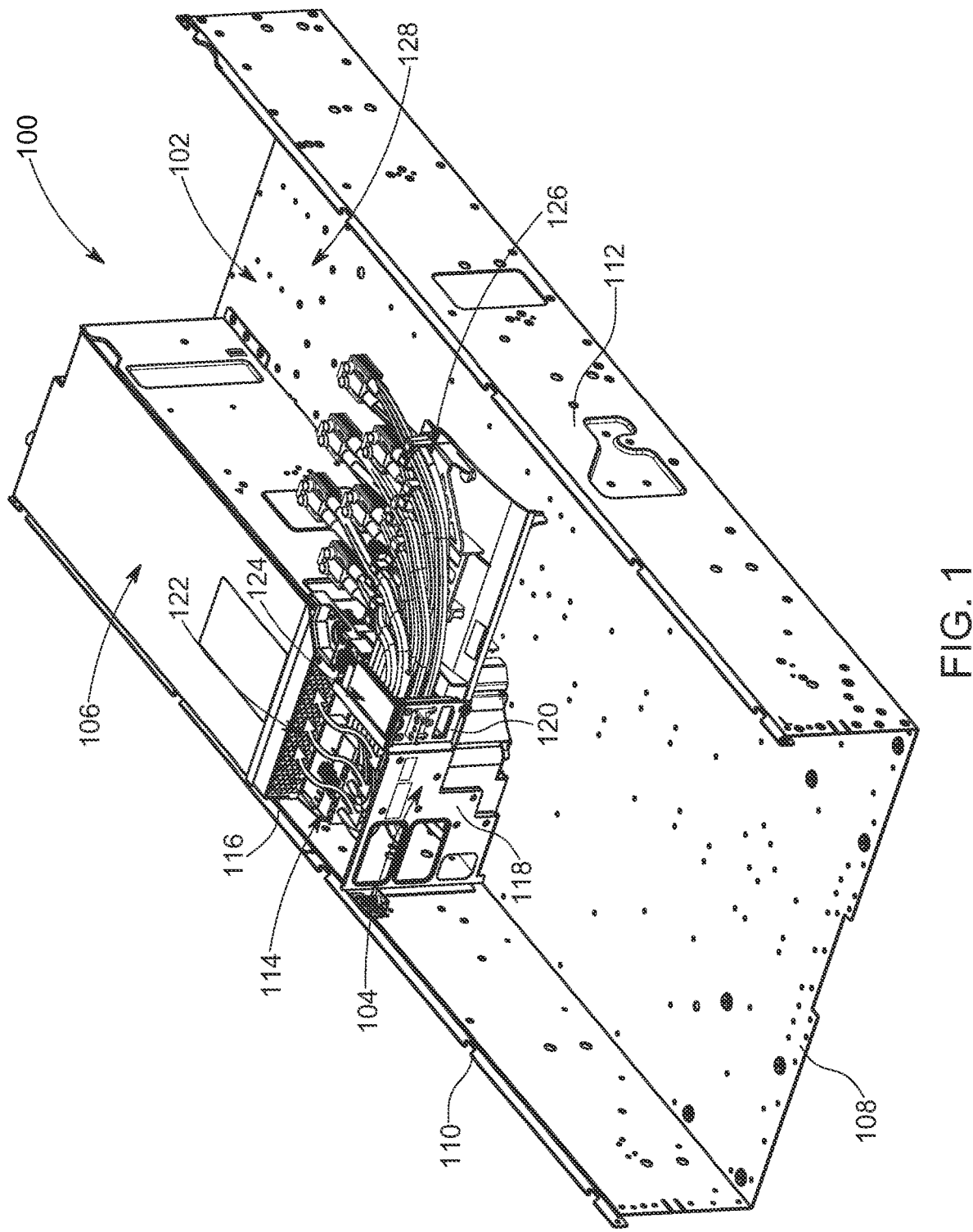
FIG. 1 is a perspective back view illustrating components of a computing assembly, in accordance with aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
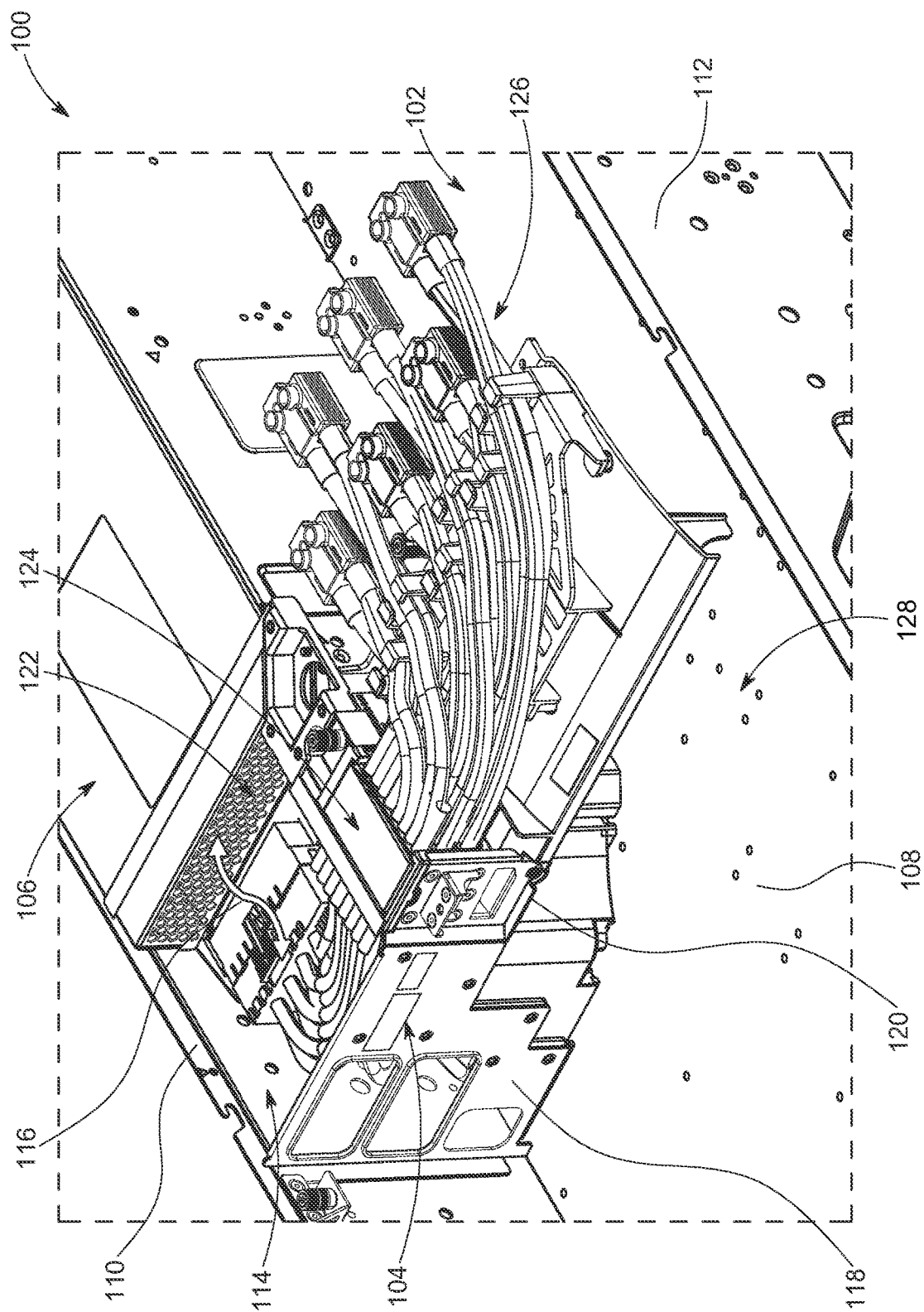
FIG. 2 is an enlarged perspective back view showing an air duct assembly illustrated in the computing assembly of FIG. 1.

Referring to FIGS. 1 and 2, a computing device 100 includes a computing chassis 102 in which an air-duct assembly 104 is received and mounted adjacent to a computing housing 106. The computing housing 106 encloses one or more electronic components that generate heat during use, such as a processing unit or a computer hard-drive.

The air-duct assembly 104 is mounted on a chassis bottom wall 108, adjacent to a chassis right wall 110, and away from a chassis left wall 112. The air-duct assembly 104 generally forms an air-duct chamber 114 adjacent to the computing housing 106 in which cooling air 116 circulates for reducing heat temperatures caused by the electronic components of the computing housing 106. The air-duct chamber 114 is defined at least in part by an air-duct top bracket (not shown), an air-duct rear bracket 118, and an air-duct side bracket 120. The air-duct top bracket is positioned generally along an air-duct top area 122, but is not shown in FIGS. 1 and 2 for purposes of more clearly showing the internal air-duct chamber 114.

The computing device 100 further includes one or more cable clip assemblies 124 positioned adjacent to the air-duct side bracket 120 to prevent, or reduce, cooling air 116 escaping from the air-duct chamber 114. Thus, by maintaining the cooling air 116 within the air-duct chamber 114 and adjacent to the electronic components within the computing housing 106, one exemplary benefit of the cable clip assembly 124 is that it helps increase cooling efficiency. Otherwise, without the cable clip assembly 124 in place, any cooling air 116 that escapes the air-duct chamber 114 reduces the cooling, potentially leading to failure of or damage to the computing device 100.

A plurality of computing cables 126 are routed through the cable clip assemblies 124 to a chassis internal space 128, which is outside the air-duct chamber 114. The computing cables 126 are routed for connecting the electronic components of the computing device 100 to each other, to power sources, or to other electronic components. Some exemplary benefits of the routed computing cables 126 include airtight routing between the air-duct chamber 114 and chassis internal space 128 and efficient and orderly spacing of the computing cables 126.

Figure 3:
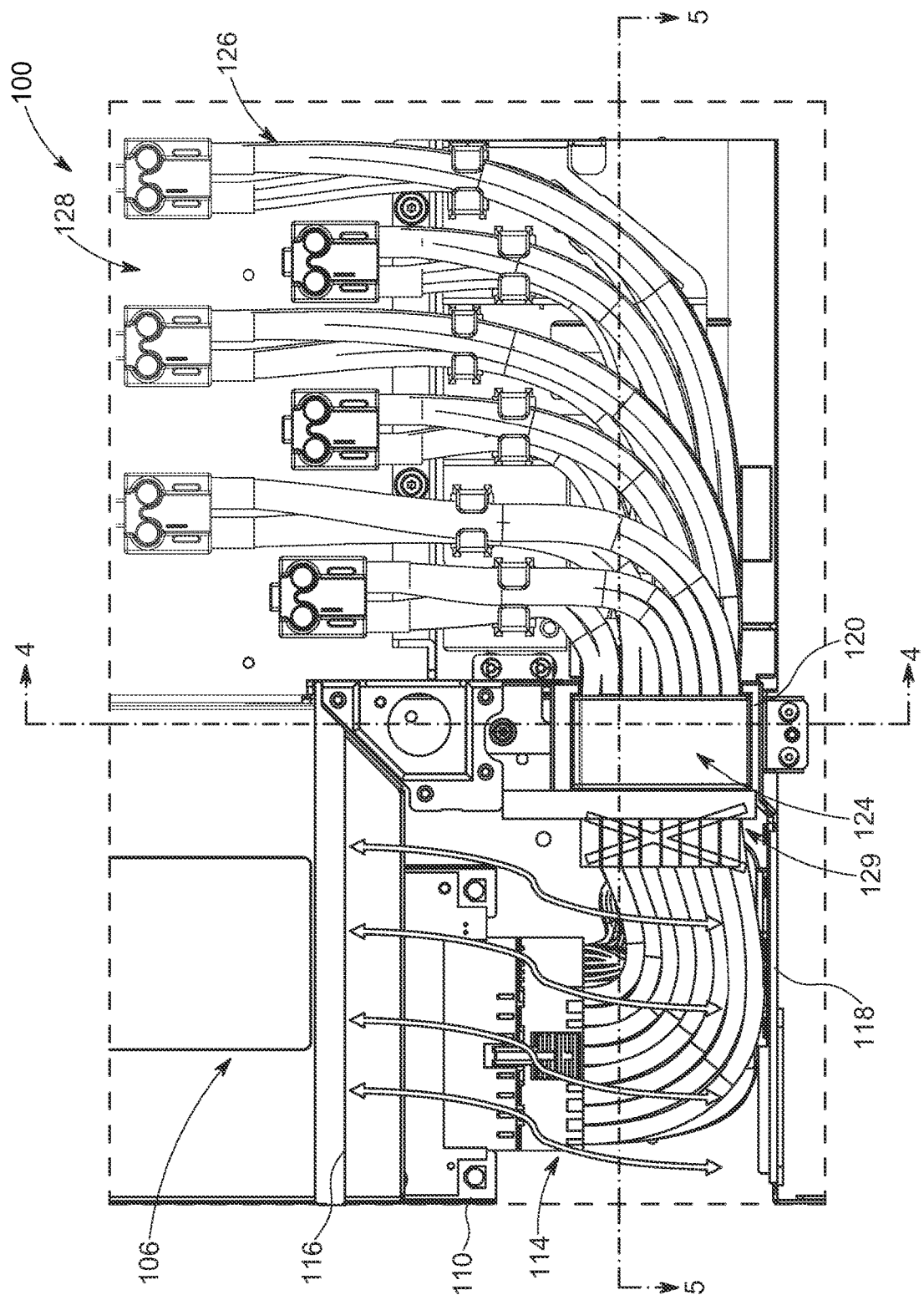
FIG. 3 is a top view of the air duct assembly illustrated in FIG. 2.
Figure 4:
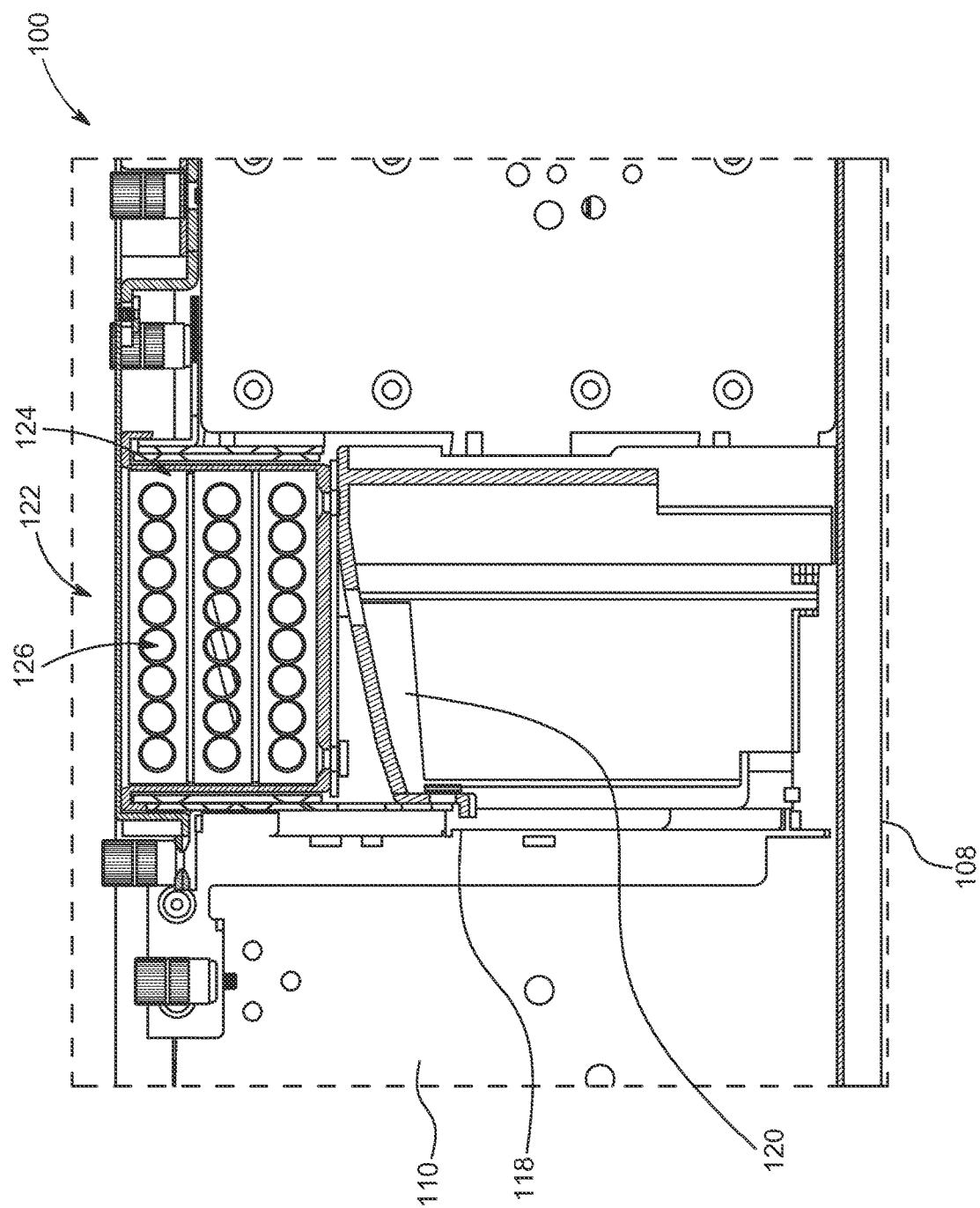
FIG. 4 is a side cross-sectional view approximately along lines "4-4" of FIG. 3.
Figure 5:
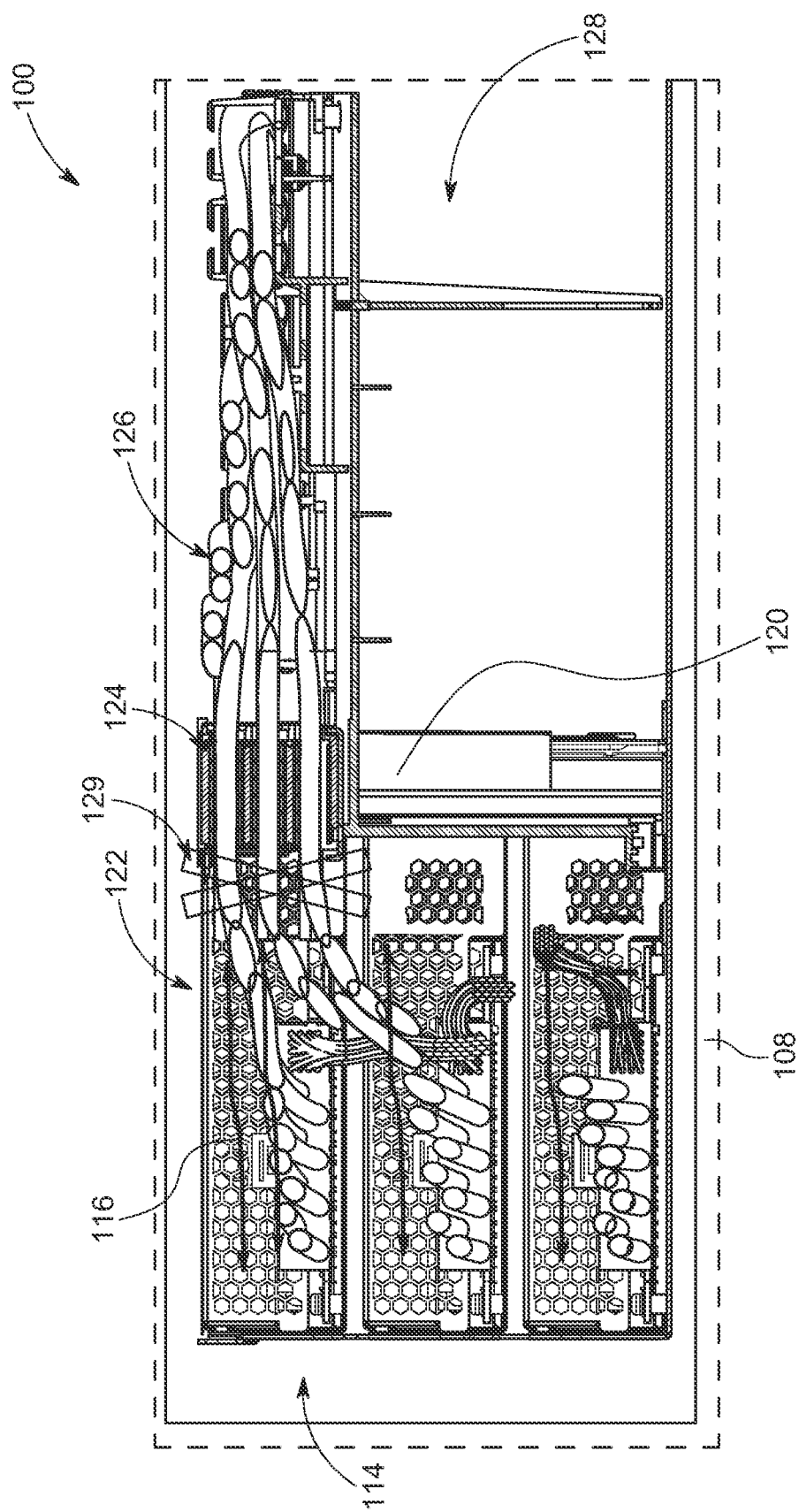
FIG. 5 is a back cross-sectional view approximately along lines "5-5" of FIG. 3.

Referring to FIGS. 3-5, supplemental illustrations show with additional detail various aspects of the features disclosed above in reference to FIGS. 1 and 2. Generally, alongside other illustrated features, the computing cables 126 are more clearly illustrated being routed from the computing housing 106, through the air-duct chamber 114, then, through the cable clip assemblies 124, and into the chassis internal space 128. The cooling air 116 is retained within the air-duct chamber 126, by being obstructed by the cable clip assemblies 124. More specifically, as shown in FIGS. 3 and 5, the cable clip assemblies 124 create an airflow barrier 129 in an installed position within the computing device 100.

Figure 6:
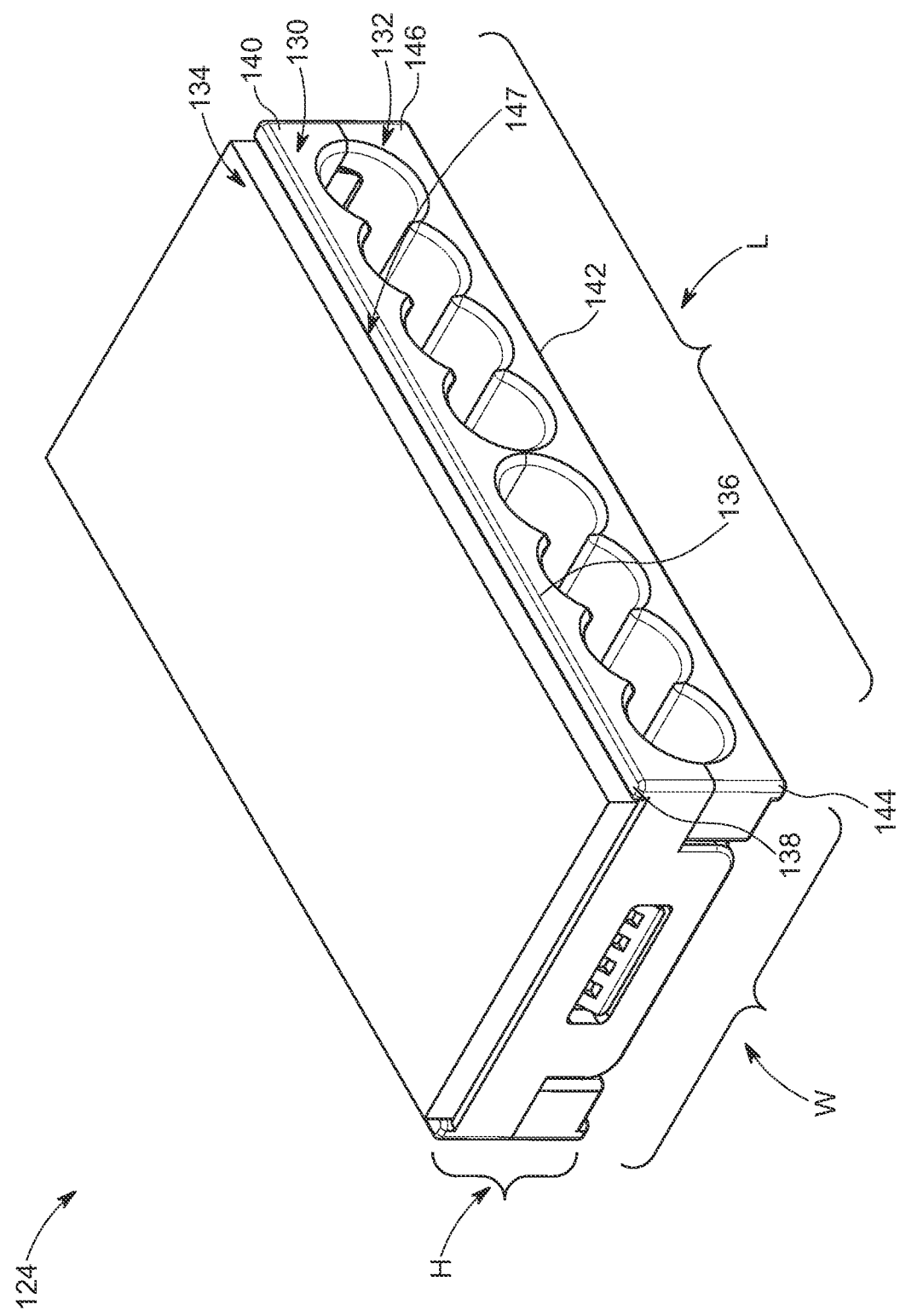
FIG. 6 is a perspective assembled view of a cable clip assembly, in accordance with aspects of the present disclosure.
Figure 7:
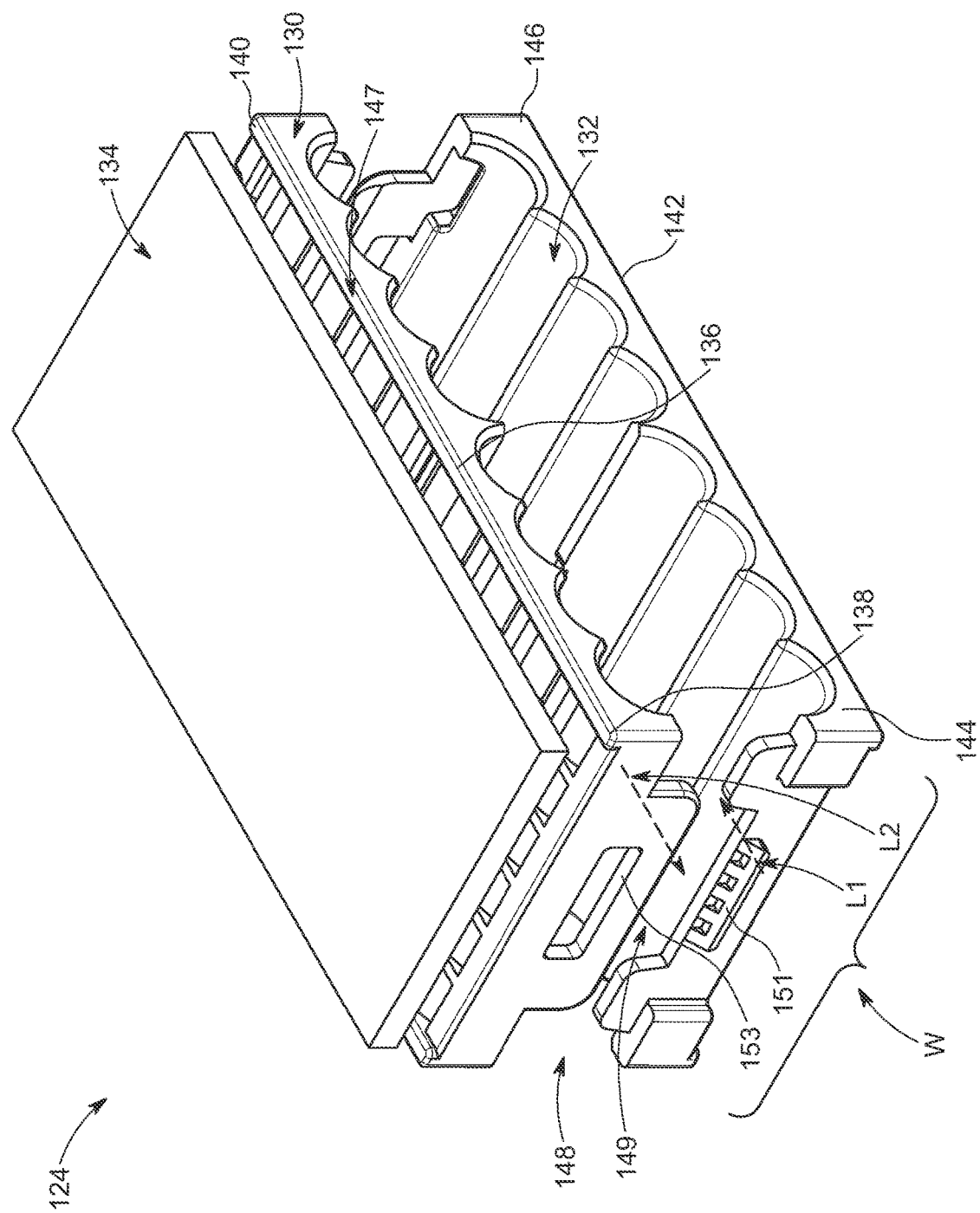
FIG. 7 is a front perspective exploded view of the cable clip assembly illustrated in FIG. 6.
Figure 8:
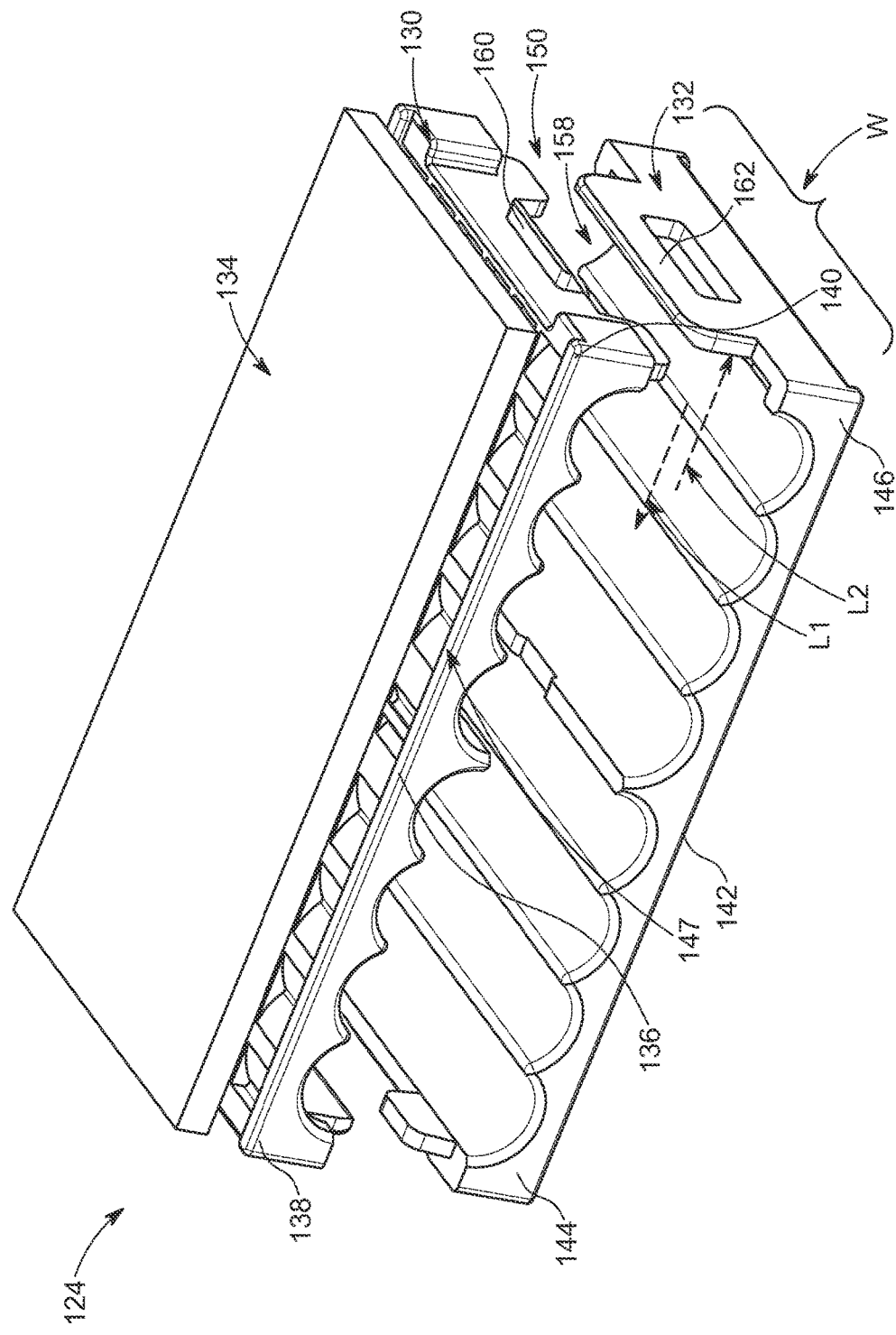
FIG. 8 is a back perspective exploded view of the cable clip assembly illustrated in FIG. 6.

Referring to FIGS. 6-8, the cable clip assembly 124 includes a primary clip 130, a secondary clip 132, and a compressible interface 134. As shown specifically in FIG. 6, the cable clip assembly 124 extends longitudinally along a length L (which is the longest dimension), laterally along a width W (which is the medium dimension), and transversely along a height H (which is the shortest dimension).

The primary clip 130 has a primary surface 136 that extends longitudinally, along the length L, between a first primary end 138 and a second primary end 140. The secondary clip 132 has a secondary surface 142 that extends longitudinally, along the length L, between a first secondary end 144 and a second secondary end 146. Optionally, the primary surface 136 includes at least a flat-shaped portion 147.

The compressible interface 134 is attached to the primary surface 136 of the primary clip 130, and includes a flexible material that compresses when subjected to an installation force. Optionally, the installation force is caused by manual intervention from a human operator when routing the computing cables 126 (shown in FIG. 4) through the cable clip assembly 124. The compressible interface 134 creates the airflow barrier 129 in the installed position within the computing device 100, as described above and illustrated in FIGS. 3 and 5.

According to an exemplary embodiment, the compressible interface 134 covers the primary surface 136 entirely. However, in other examples, the compressible interface 134 covers only parts of the primary surface 136. According to another exemplary embodiment, the compressible interface 134 includes in part or in whole a sponge material.

Figure 9:
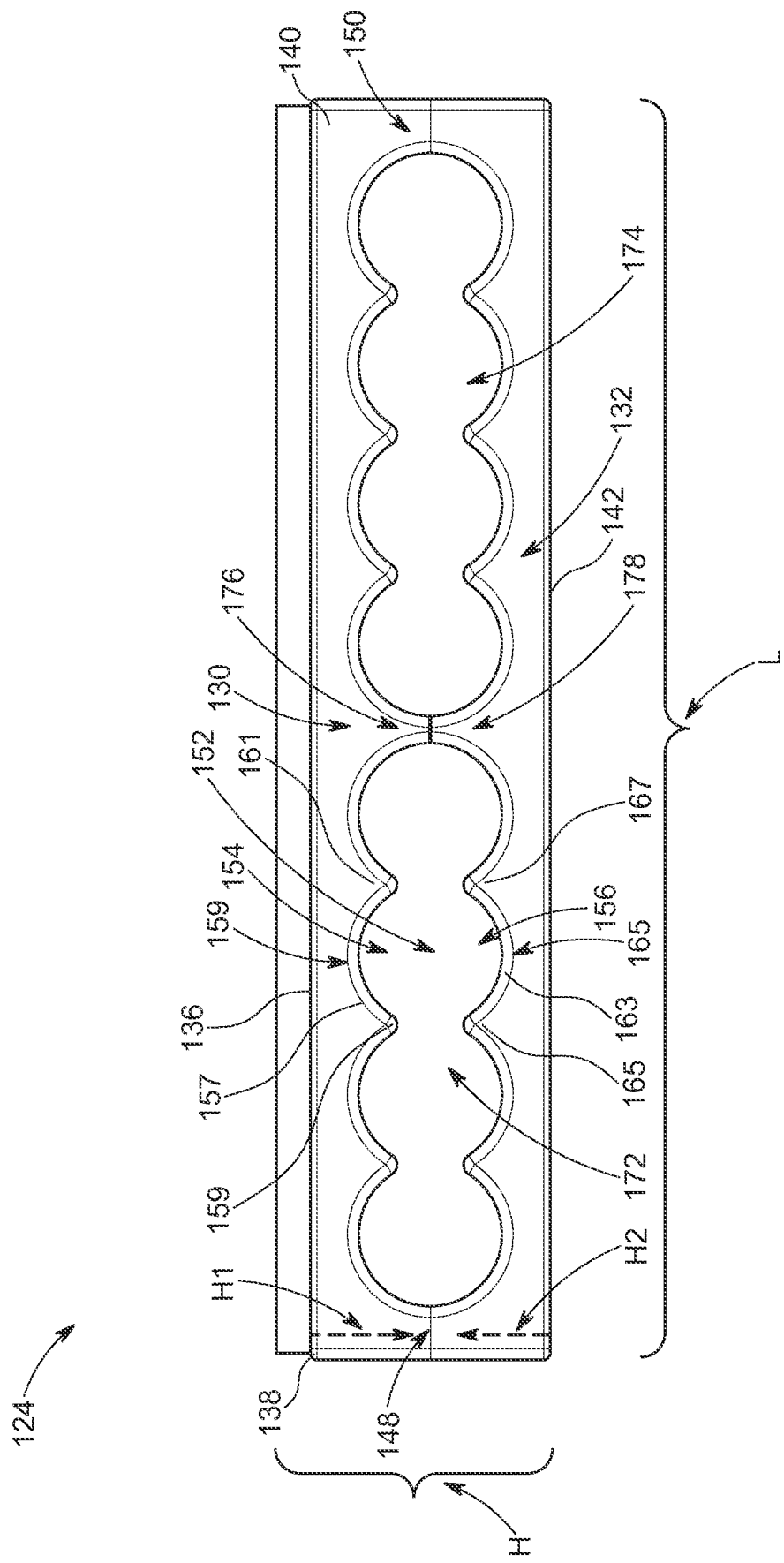
FIG. 9 is a front assembled view of the cable clip assembly of FIG. 6.
Figure 10:
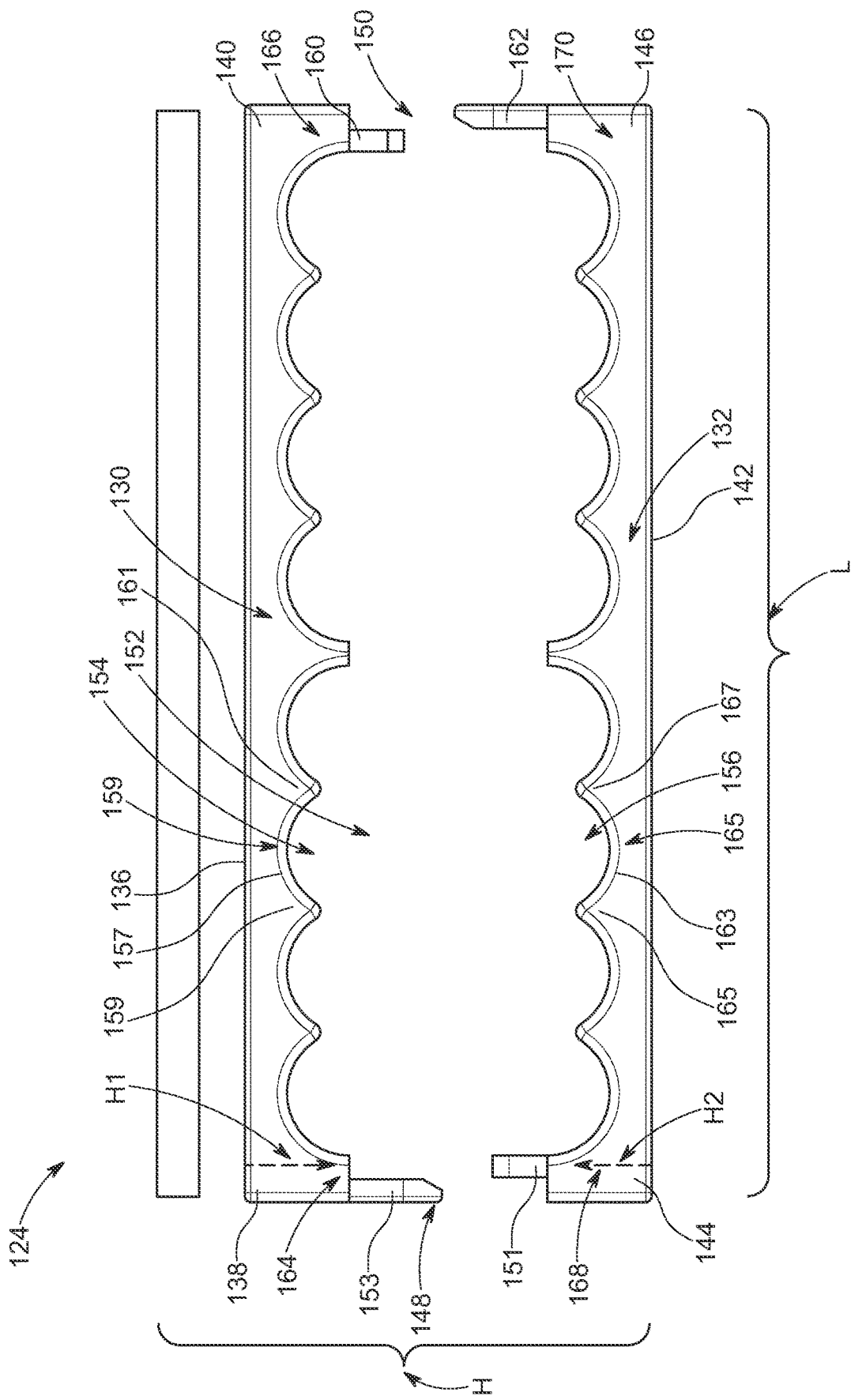
FIG. 10 is a front exploded view of the cable clip assembly of FIG. 6.

Referring to FIGS. 9 and 10, the cable clip assembly 124 further includes a first side 148 and a second side 150. The first side 148 extends in a first transverse direction H1, along the height H, from the first primary end 138. The second side 150 extends in the first transverse direction H1 from the second primary end 140.

The cable clip assembly 124 further includes a plurality of cable-receiving holes 152, which are arranged longitudinally (along the length L) between the first side 148 and the second side 150. According to the illustrated example, each cable-receiving hole 152 is a circular hole. However, in other embodiments, the shape of one or more of the cable-receiving holes 152 is different than a circular hole, e.g., square, rectangular, etc. According to other embodiments, the shape and size of at least one of the cable-receiving holes 152 is different from another one of the cable-receiving holes 152.

Each of the cable-receiving holes 152 is separated into a semi-circular primary cable-receiving indentation 154 that matches a respective secondary semi-circular cable-receiving indentation 156. The separate indentations 154, 156 (more clearly illustrated in FIG. 10) are separated from each other when the secondary clip 132 is moved away from or disassembled from the primary clip 130.

Each primary cable-receiving indentation 154 is generally defined by a primary contact surface 157 that extends longitudinally between two primary ridges 159, 161. Each primary cable-receiving indentation 154 further extends laterally the entire width W (illustrated in FIGS. 6-8) of the primary surface 136. The primary contact surface 157 optionally has a middle area 159 that is closer to the primary surface 136 than to the primary ridges 159, 161.

Each secondary cable-receiving indentation 156 is generally defined by a secondary contact surface 163 that extends longitudinally between two secondary ridges 165, 167. Each secondary cable-receiving indentation 156 further extends laterally the entire width W (illustrated in FIGS. 6-8) of the secondary surface 142. The secondary contact surface 163 optionally has a middle area 165 that is closer to the secondary surface 142 than to the primary ridges 165, 167.

The secondary clip 132 is attached to the primary clip 130 via the first side 148 and via the second side 150. The secondary clip 132 is movable relative to the primary clip 130 between a cable installation position (illustrated in FIG. 10) and a secured cable position (illustrated in FIG. 9). In the illustrated embodiment, the secondary clip 132 is removably attached at both first and second sides 148, 150.

According to the illustrated example, each of the first and second sides 148, 150 has toolless connectors for removal or attachment of the primary clip 130 and the secondary clip 132. Referring back to FIG. 7, the first side 148 includes a first primary connector 149 having a first toolless retainer 151 and a first toolless receiver 153. The first toolless retainer 151 is received and assembled, without use of any tools, within the first toolless receiver 153 in response to a snapping action. The first toolless retainer 151 is removed and dissembled, without use of any tools, from within the first toolless receiver 153 in response to a slight bending force applied along the longitudinal direction. The bending force is applied to either the first toolless retainer 151, in a first longitudinal direction L1, or the first toolless receiver 153, in a second longitudinal direction L2. The bending force releases the first toolless retainer 151 from the first toolless receiver 153, resulting in the disassembly of the primary clip 130 from the secondary clip 132 at the first side 148.

Referring back to FIG. 8, the second side 150 includes a second primary connector 158 having a second toolless retainer 160 and a second toolless receiver 162. The second toolless retainer 160 is received and assembled, without use of any tools, within the second toolless receiver 162 in response to a snapping action. The second toolless retainer 160 is removed and dissembled, without use of any tools, from within the second toolless receiver 162 in response to a slight bending force applied along the longitudinal direction. The bending force is applied to either the second toolless retainer 160, in the second longitudinal direction L2, or the second toolless receiver 162, in the first longitudinal direction L1. The bending force releases the second toolless retainer 160 from the second toolless receiver 162, resulting in the disassembly of the primary clip 130 from the secondary clip 132 at the second side 150.

The first and second sides 148, 150 refer generally to the connecting material between the primary and secondary clips 130, 132. However, for clarity, the first and second sides 148, 150 are optionally separated into respective side portions integrated with the primary and secondary clips 130, 132.

Referring back to FIG. 10, in the illustrated exemplary embodiment, the primary clip 130 includes a first primary side 164 that extends in the first transverse direction H1 from the first primary end 138. The primary clip 130 further includes a second primary side 166 that extends in the first transverse direction H1 from the second primary end 140. The first primary side 164 is generally part of the first toolless receiver 153 and the second primary side 166 is generally part of the second toolless retainer 160.

Similarly, the secondary clip 132 includes a first secondary side 168 extending in a second transverse direction H2 from the first secondary end 144. The second transverse direction H2 is opposite the first transverse direction H1. The secondary clip 132 further includes a second secondary side 170 that extends in the second transverse direction H2 from the second secondary end 146. The first secondary side 168 is generally part of the first toolless retainer 151 and the second secondary side 170 is generally part of the second toolless receiver 162.

Referring back to FIG. 9, according to an optional feature, the cable clip assembly 124 is divided into two cable-receiving sections 172, 174, with each section 172, 174 having four cable-receiving holes 152. The sections 172, 174 are separated via a plurality of section ridges 176, 178 that are in contact, or adjacent, to each other. In contrast, the other ridges 159, 161, 165, 167 are separated by a gap. In alternative embodiments, the cable clip assembly 124 has a different number of cable-receiving sections 172, 174, or a different number of cable-receiving holes 152 for each cable-receiving section 172, 174.

Figure 11:
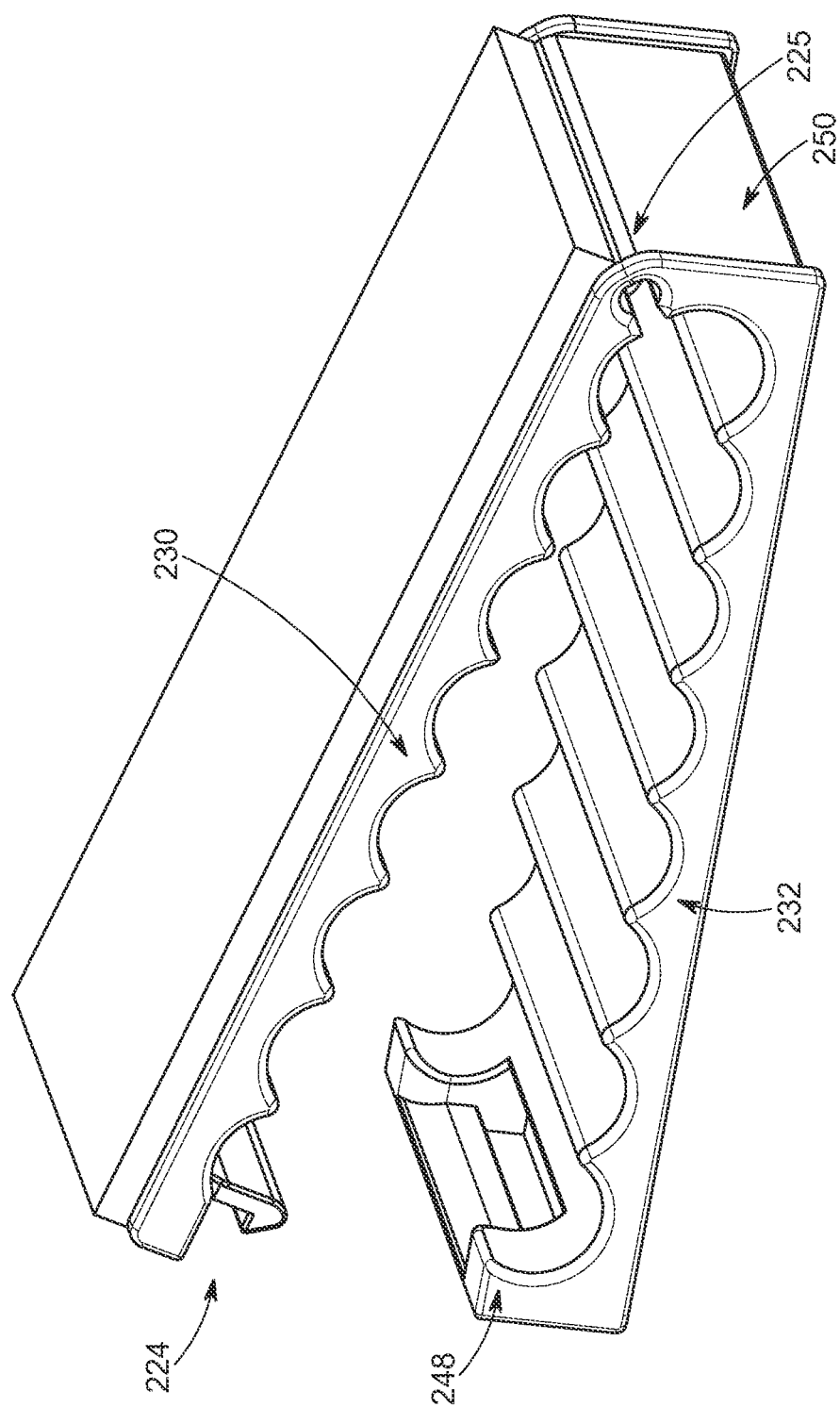
FIG. 11 is a perspective view illustrating another cable clip assembly, in accordance with aspects of the present disclosure.

Referring to FIG. 11, another cable clip assembly 224 includes a rotational hinge connector 225 for allowing rotational movement between a primary clip 230 and a secondary clip 232. Instead of having both sides removably attached, the cable clip assembly 224 has a first side 248 that removably attaches the primary clip 230 and the secondary clip 232, via disconnecting toolless connectors as disclosed above in reference to FIGS. 6-10. However, the primary clip 230 and the secondary clip 232 are permanently, but rotationally, fixed at a second side 250. Thus, to change from the cable installation position (which is illustrated in FIG. 11) to the secured cable position, the primary clip 230 is rotated counterclockwise towards the secondary clip 232 until the toolless connectors of the first side 248 are assembled, or snapped in place. To change from the secured cable position to the cable installation position, the primary clip 230 is rotated clockwise away from the secondary clip 232, after disconnecting the toolless connectors of the first side 248.

Figure 12:
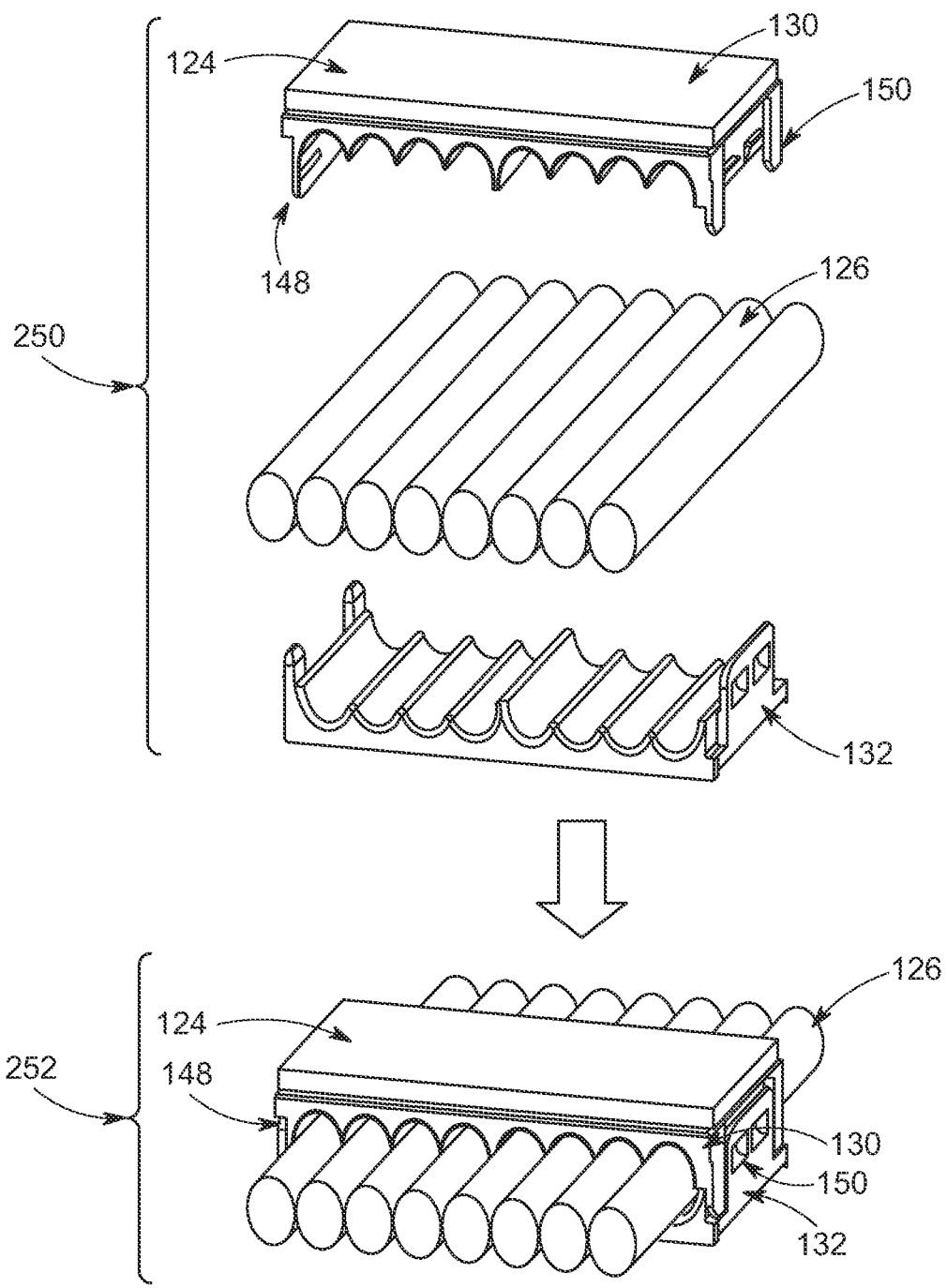
FIG. 12 is a perspective view illustrating installation of computing cables in cable clip assemblies, in accordance with one embodiment of the present disclosure.

Referring to FIG. 12, the computing cables 126 are installed in the cable clip assembly 124, in which the primary and secondary clips 130, 132 are removably attached at both sides 148, 150. Initially, in a cable installation position 250, the primary clip 130 is separated from the secondary clip 132, while the computing cables 126 are routed respectively within the cable-receiving holes 152. Then, in a secured cable position 252, the primary clip 130 is attached to the secondary clip 132, clamping within the computing cables 126.

Figure 13:
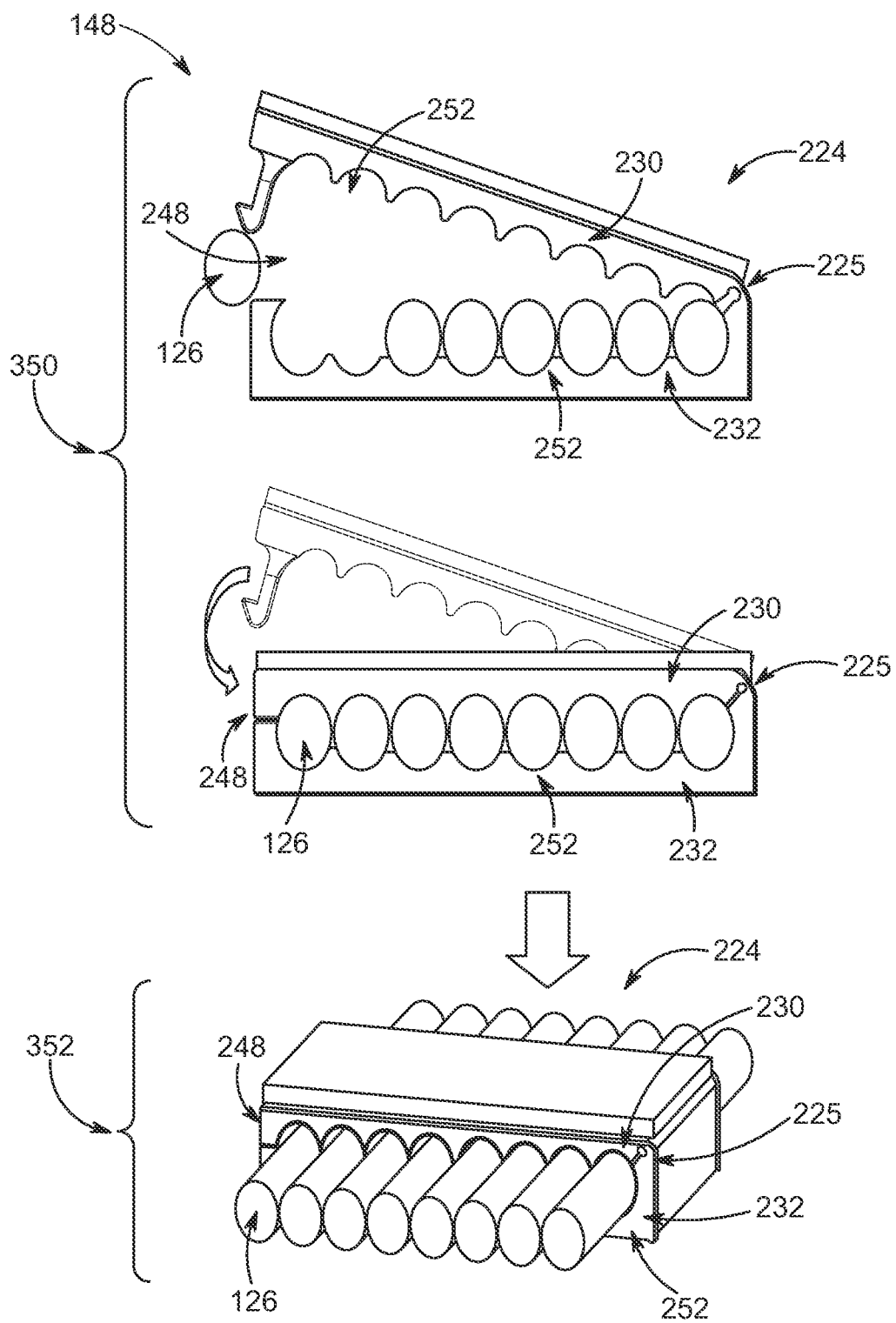
FIG. 13 is an illustration showing installation of computing cables in cable clip assemblies, in accordance with another embodiment of the present disclosure.

Referring to FIG. 13, the computing cables 126 are installed in the cable clip assembly 224, in which the primary and secondary clips 230, 232 are rotationally attached at the rotational hinge connector 225. Initially, in a cable installation position 350, the primary clip 230 is separated from the secondary clip 232 at the first side 248, while the computing cables 126 are routed respectively within cable-receiving holes 252. Then, in a secured cable position 352, the primary clip 230 is rotated counterclockwise towards the secondary clip 232, clamping within the computing cables 126.

Figure 14:
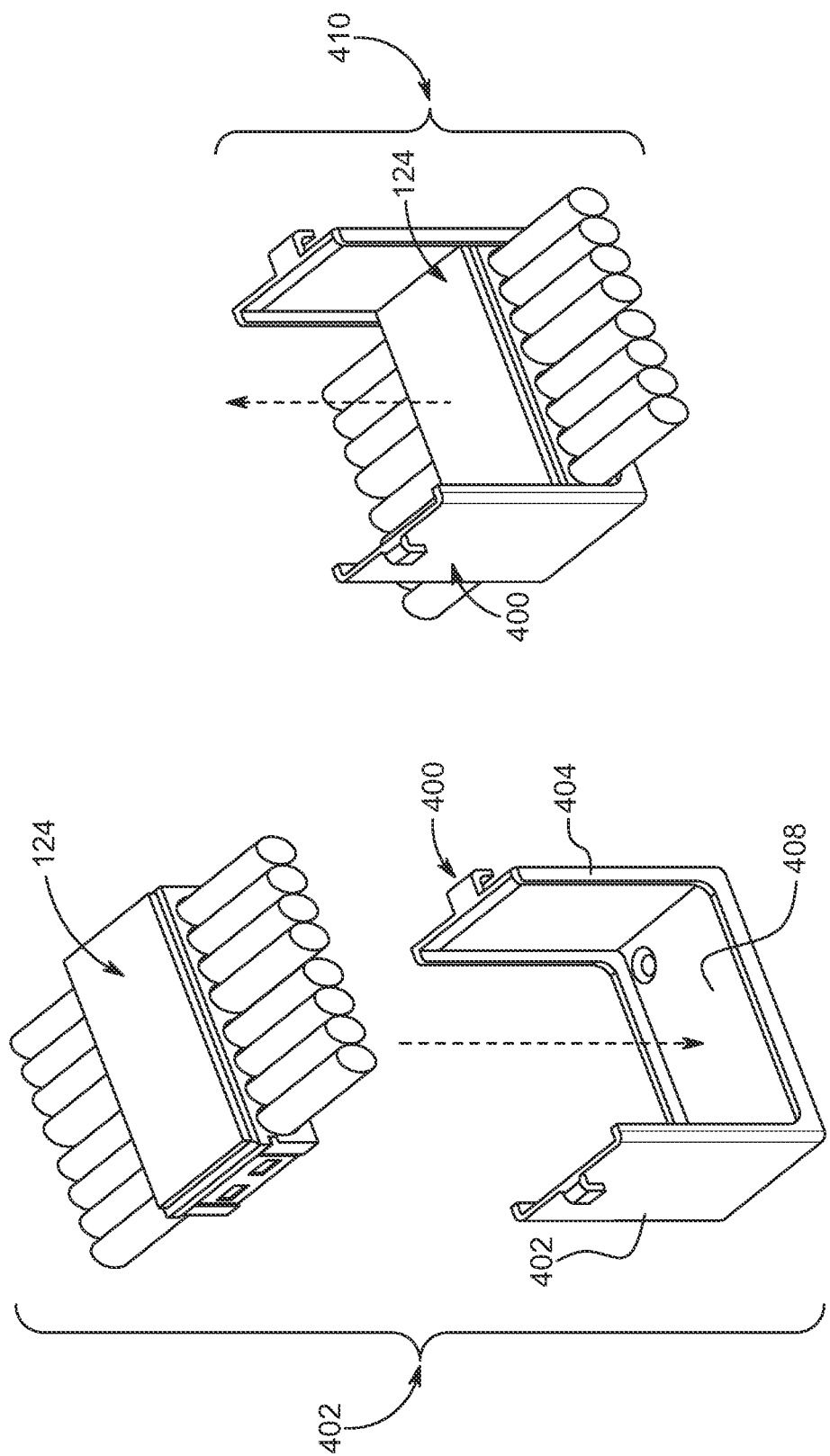
FIG. 14 is a perspective view illustrating installation of a cable clip assembly in a cable duct, in accordance with aspects of the present disclosure.

Referring to FIG. 14, the cable clip assembly 124 is mounted within a cable duct 400. The cable duct 400 is removably or permanently affixed in the air-duct assembly 104 (shown in FIGS. 1 and 2). In an installation position 402, the cable clip assembly 124 is inserted between two side walls 404, 406 of the cable duct 400 and pressed in contact with a bottom wall 408. The bottom wall 408 connects the two side walls 404, 460, to form the cable duct 400 into a general C-shaped fixture. In an uninstall position 410, the cable clip assembly 124 is removed from within the cable duct 400.

Figure 15:
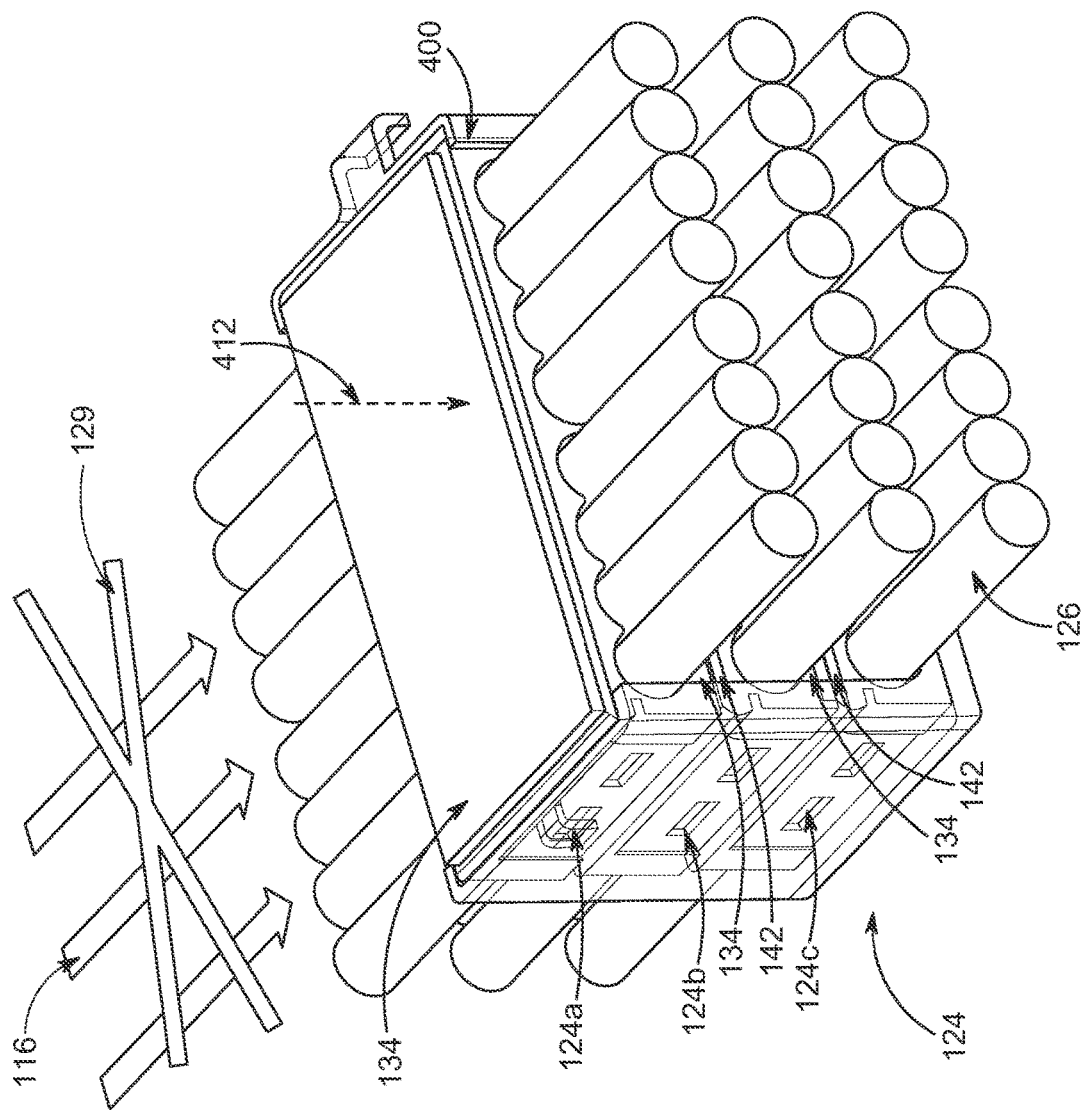
FIG. 15 is a perspective view illustrating installation of a multiple cable clip assemblies in the cable duct of FIG. 14.

Referring to FIG. 15, additional cable clip assemblies 124 are mounted within the cable duct 400. Specifically, the cable clip assemblies 124 include a first cable clip assembly 124a, a second cable clip assembly 124b, and a third cable clip assembly 124c. Each of the cable clip assemblies 124 is stacked in contact with an adjacent one of the cable clip assemblies 124. The stacking of the cable clip assemblies 124 results in an installation force 412. The installation force 412 is caused when the compressible interface 134 of one cable clip assembly 124 is in direct contact with a secondary surface 142 of another cable clip assembly 124 that is installed in the computing device 100 (shown in FIG. 1).

For example, the compressible interface 134 of the first cable clip assembly 124a is in direct contact with the secondary surface 142 of the second cable clip assembly 124b, and the compressible interface 134 of the second cable clip assembly 124b is in direct contact with the secondary surface 142 of the third cable clip assembly 124c. The cable clip assemblies 124a-124c, along with the routed computing cables 126, create the airflow barrier 129 that blocks the cooling air 116 from escaping the air-duct chamber 114 (which is shown in FIGS. 1-3).

Optionally, different types of cable clip assemblies 124, 224 are used together to form the airflow barrier 129. Thus, one or more of the cable clip assemblies 124 includes the rotationally-assembled cable clip assembly 224, as disclosed above in more detail.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cable clip assembly for a computing device, the cable clip assembly comprising:
    a primary clip having a primary surface extending longitudinally, along a length of the cable clip assembly, between a first primary end and a second primary end;
    a first side extending in a first transverse direction, along a height of the cable clip assembly, from the first primary end;
    a second side extending in the first transverse direction from the second primary end;
    a plurality of cable-receiving holes arranged longitudinally between the first side and the second side, the plurality of cable-receiving holes including a plurality of primary cable receiving indentations, each primary indentation of the plurality of primary cable-receiving indentations extending longitudinally between two primary ridges;
    a secondary clip having a secondary surface, the secondary clip being attached to the primary clip via the first side and the second side, the secondary clip being movable relative to the primary clip between a cable installation position and a secured cable position, the secondary clip being removably attached at one or more of the first side and the second side, the plurality of cable-receiving holes further including a plurality of secondary cable-receiving indentations;
    each secondary indentation of the plurality of secondary cable-receiving indentations matching a respective one of the plurality of primary cable-receiving indentations to form an enclosed cable receiving hole when the secondary clip is assembled with the primary clip, each secondary indentation extending longitudinally between two secondary ridges, the two secondary ridges facing and being aligned, respectively, with the two primary ridges;
    a compressible interface attached to the primary surface, the compressible interface including a flexible material that compresses when subjected to an installation force, the flexible material compressing more than a material included in the primary clip, the compressible interface creating an airflow barrier in an installed position within the computing device; and
    a rotational hinge connector attaching the primary clip and the secondary clip.

2. The cable clip assembly of claim 1, wherein the compressible interface covers the primary surface entirely.

3. The cable clip assembly of claim 1, wherein the installation force is caused when the compressible interface is in direct contact with a secondary surface of another cable clip assembly installed within the computing device.

4. The cable clip assembly of claim 1, wherein each of the first side and the second side has toolless connectors for removal or attachment of the primary clip and the secondary clip.

5. The cable clip assembly of claim 1, wherein the primary clip is connected to the secondary clip at the second side via the rotational hinge connector, the primary clip being rotated away from the secondary clip at the first side in the cable installation position.

6. The cable clip assembly of claim 1, wherein one or more holes of the plurality of cable-receiving holes is a circular hole.

7. A cable clip assembly for a computing device, the cable clip assembly comprising:
- a primary clip defined by a length of the cable clip assembly along a longitudinal direction, a width of the cable clip assembly along a lateral direction, and a height of the cable clip assembly along a transverse direction, the primary clip having
    - a primary surface extending longitudinally between a first primary end and a second primary end,
    - a first primary side extending in a first transverse direction from the first primary end,
    - a second primary side extending in the first transverse direction from the second primary end, and
- a plurality of primary cable-receiving indentations arranged longitudinally between the first primary side and the second primary side, each primary indentation of the plurality of primary cable-receiving indentations extending longitudinally between two primary ridges;
- a secondary clip having
    - a secondary surface extending longitudinally between a first secondary end and a second secondary end,
    - a first secondary side extending in a second transverse direction from the first secondary end, the second transverse direction being opposite to the first transverse direction, the first secondary side being removably attached to the first primary side of the primary clip,
    - a second secondary side extending in the second transverse direction from the second secondary end, the second secondary side being removably attached to the second primary side of the primary clip, and
    - a plurality of secondary cable-receiving indentations arranged longitudinally between the first secondary side and the second secondary side, each secondary indentation of the plurality of secondary cable-receiving indentations matching a respective one of the plurality of primary cable receiving indentations to form an enclosed cable-receiving hole when the secondary clip is assembled with the primary clip, each secondary indentation extending longitudinally between two secondary ridges, the two secondary ridges facing and being aligned, respectively, with the two primary ridges; and
    - a compressible interface attached to the primary surface, the compressible interface including a flexible material that compresses when subjected to an assembly force, the flexible material compressing more than a material included in the primary clip, the compressible interface creating an airflow barrier when the cable clip assembly is in an installed position within the computing device;
- wherein the primary clip is removably attached to the secondary clip.

8. The cable clip assembly of claim 7, wherein the primary surface includes at least a flat-shaped portion.

9. The cable clip assembly of claim 7, wherein the compressible interface covers the primary surface entirely.

10. The cable clip assembly of claim 7, wherein each indentation of the plurality of primary cable-receiving indentations is defined by a primary contact surface extending longitudinally between the two primary ridges, each primary indentation extending laterally the entire width of the primary surface.

11. The cable clip assembly of claim 10, wherein the primary contact surface has a middle area that is closer to the primary surface than to the primary ridges.

12. The cable clip assembly of claim 7, wherein each indentation of the plurality of secondary cable-receiving indentations is defined by a secondary contact surface extending longitudinally between the two secondary ridges, each secondary indentation extending laterally the entire width of the secondary surface.

13. The cable clip assembly of claim 7, wherein the first primary side has a first primary connector, the second primary side has a second primary connector, the first secondary side has a first secondary connector, and the second secondary side has a second secondary connector, each of the first primary connector, the second primary connector, the first secondary connector, and the second secondary connector being a toolless connector.

14. The cable clip assembly of claim 7, wherein the enclosed cable-receiving hole is a circular hole.

* * * * *